(12) United States Patent
Refai-Ahmed et al.

(10) Patent No.: US 8,574,965 B2
(45) Date of Patent: Nov. 5, 2013

(54) SEMICONDUCTOR CHIP DEVICE WITH LIQUID THERMAL INTERFACE MATERIAL

(75) Inventors: Gamal Refai-Ahmed, Markham (CA); Michael Z. Su, Round Rock, TX (US); Bryan Black, Spicewood, TX (US)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 349 days.

(21) Appl. No.: 12/910,379

(22) Filed: Oct. 22, 2010

(65) Prior Publication Data

US 2012/0098119 A1    Apr. 26, 2012

(51) Int. Cl.
*H01L 21/00* (2006.01)

(52) U.S. Cl.
USPC ............. 438/125; 257/E21.499; 257/E23.001

(58) Field of Classification Search
USPC .................. 438/121, 122, 125; 257/E21.499, 257/E23.001
See application file for complete search history.

(56) References Cited

U.S. PATENT DOCUMENTS

| 4,961,106 | A | * | 10/1990 | Butt et al. | 257/710 |
| 5,888,631 | A | * | 3/1999 | Sylvester | 428/212 |
| 2002/0039279 | A1 | * | 4/2002 | Ishikawa et al. | 361/687 |
| 2006/0033205 | A1 | | 2/2006 | Sauciuc et al. | |

OTHER PUBLICATIONS

U.S. Appl. No. 12/643,477, filed Dec. 21, 2009, Michael Z. Su.

* cited by examiner

*Primary Examiner* — Michelle Mandala
(74) *Attorney, Agent, or Firm* — Timothy M. Honeycutt

(57) ABSTRACT

A method of manufacturing is provided that includes providing a semiconductor chip device that has a circuit board and a first semiconductor chip coupled thereto. A lid is placed on the circuit board. The lid includes an opening and an internal cavity. A liquid thermal interface material is placed in the internal cavity for thermal contact with the first semiconductor chip and the circuit board.

23 Claims, 5 Drawing Sheets

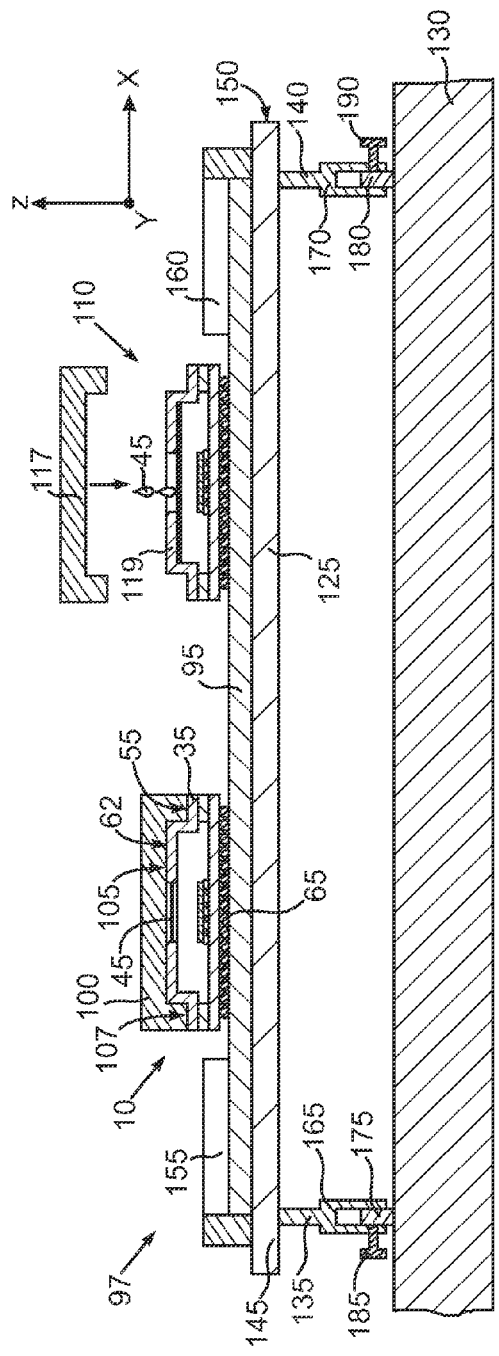

SEMICONDUCTOR CHIP DEVICE WITH LIQUID THERMAL INTERFACE MATERIAL

BACKGROUND OF THE INVENTION

1. Field of the Invention

This invention relates generally to semiconductor processing, and more particularly to thermal interface material structures for semiconductor chip packaging and to methods of making the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. Gel-type thermal interface materials, such as greases, generally do exhibit flow properties like liquids at or near room temperature. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces.

Stacked dice present an additional technical challenge for integration of solder thermal interface materials. A stacked dice arrangement is non-planar relative to the underlying package substrate, yet thermal contact between the solder thermal interface material, each chip and the lid is often desired. This can expose the exterior sidewalls of the uppermost of the stacked dice to potential diffusion of solder into critical circuit structures.

One conventional design used for thermal management of a single die central processing unit (CPU) incorporated a plastic frame positioned on the CPU package substrate and a thermal grease disposed within the frame. Such a conventional design was once used on a G5 desktop computer produced by Apple Computer Corporation.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes providing a semiconductor chip device that has a circuit board and a first semiconductor chip coupled thereto. A lid is placed on the circuit board. The lid includes an opening and an internal cavity. A liquid thermal interface material is placed in the internal cavity for thermal contact with the first semiconductor chip and the circuit board.

In accordance with another aspect of an embodiment of the present invention, a method of manufacturing is provided that includes providing a semiconductor chip package that has a package substrate and a first semiconductor chip coupled thereto. A lid is placed on the package substrate. The lid includes an opening and an internal cavity. A liquid thermal interface material is placed in the internal cavity for thermal contact with the first semiconductor chip and the circuit board.

In accordance with another aspect of an embodiment of the present invention, an apparatus is provided that includes a circuit board and a first semiconductor chip coupled to the circuit board. A lid is coupled to the circuit board. The lid includes an opening and an internal cavity. A liquid thermal interface material is in the internal cavity for thermal contact with the first semiconductor chip and the circuit board.

BRIEF DESCRIPTION OF THE DRAWINGS

The foregoing and other advantages of the invention will become apparent upon reading the following detailed description and upon reference to the drawings in which:

FIG. 3 is a sectional view depicting an exemplary semiconductor chip device supported on an exemplary support member;

FIG. 4 is a sectional view depicting an alternate exemplary semiconductor chip device supported on an alternate exemplary support member;

DETAILED DESCRIPTION OF SPECIFIC EMBODIMENTS

Various embodiments of semiconductor chip device that incorporates a liquid thermal interface material are disclosed.

One example includes a semiconductor chip mounted to a circuit board. A lid is positioned on the circuit board over the semiconductor chip. Together, the lid and the circuit define an interior space that is at least partially filled with a liquid thermal interface material. Other features will now be described.

Figure 1:
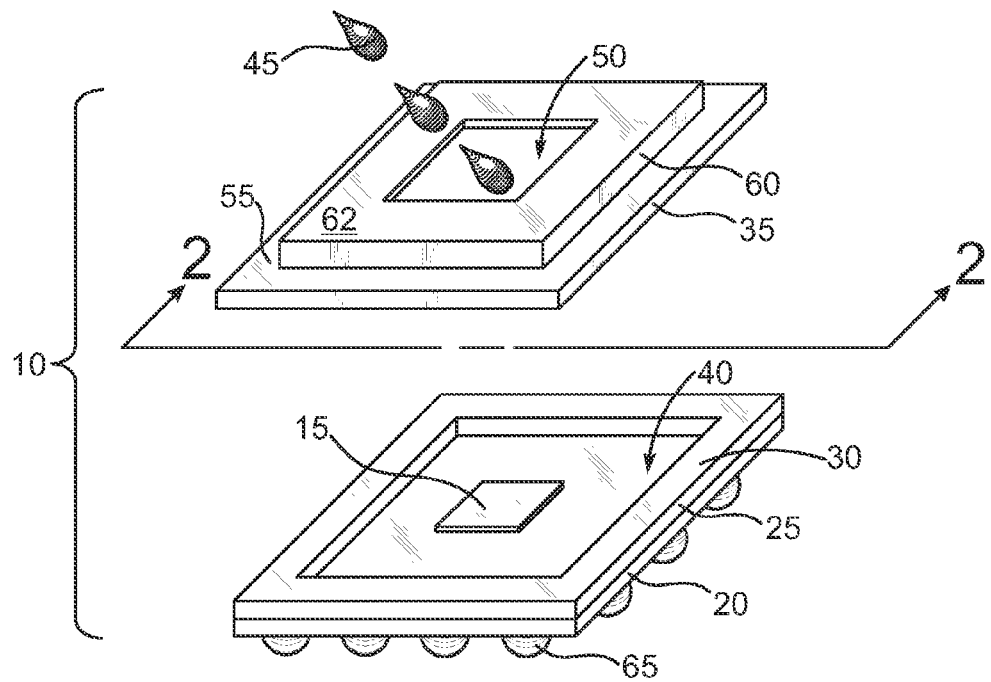
FIG. 1 is a partially exploded pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1 therein is shown a partially exploded pictorial view of an exemplary embodiment of a semiconductor chip device 10 that includes a semiconductor chip 15 mounted on a circuit board 20. The semiconductor chip 15 is encircled by an optional stiffener frame 25 that is mounted on the circuit board 20. The stiffener frame 25 includes a seating surface 30 that is designed to receive a lid 35. The lid 35 has an internal cavity 40 suitable to hold a liquid thermal interface material 45. The liquid thermal interface material 45 may be introduced through the lid 35 by way of a suitable opening 50. Together, the circuit board 20, the internal cavity 40 of the lid 35 and the optional stiffener frame 25 define an interior space. The liquid thermal interface material 45 is designed to establish thermal contact with the semiconductor chip 15 and the circuit board 20. Here, the lid 35 may have a generally top hat configuration that includes a lower bill portion 55 and an upper cap portion 60. The bill portion 55 is designed to receive a secondary lid or heat spreader (not visible) that is designed to seal off the opening 50 after the thermal interface material 45 is introduced.

It should be understood that the semiconductor chip 15 and the lid 35 may be mounted to any of a myriad of different types of circuit boards or carrier substrates as desired. The mounting structures and techniques described herein are not limited to any particular types of semiconductor devices. Thus, the semiconductor chip 15 may be any of a myriad of different types of circuit devices used in electronics, such as, for example, microprocessors, graphics processors, combined microprocessor/graphics processors, application specific integrated circuits, memory devices, active optical devices, such as lasers, passive optical devices or the like, and may be single or multi-core or even stacked vertically and/or laterally with additional dice. Furthermore, the semiconductor chip 15 could be configured as an interposer with or without some logic circuits. Thus the term "chip" includes an interposer and vice versa. The semiconductor chip 15 may be constructed of bulk semiconductor, such as silicon or germanium, or semiconductor-on-insulator materials, such as silicon-on-insulator materials, or even other types of materials, such as silicon dioxide, tetra-ethyl-ortho-silicate or the like.

The circuit board 20 may take on a variety of configurations. Examples include a semiconductor chip package substrate, a circuit card, or virtually any other type of printed circuit board. Although a monolithic structure could be used for the circuit board 20, a more typical configuration will utilize a buildup design. In this regard, the circuit board 20 may consist of a central core upon which one or more buildup layers are formed and below which an additional one or more buildup layers are formed. The core itself may consist of a stack of one or more layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chip 15 and another device, such as another circuit board for example. Input/output structures, such as solder balls 65 in this illustrative embodiment, may be used to interface the circuit board 20 with another device. Of course, systems other than a ball grid array may used, such as pin grid arrays, land grid arrays or others.

Figure 2:
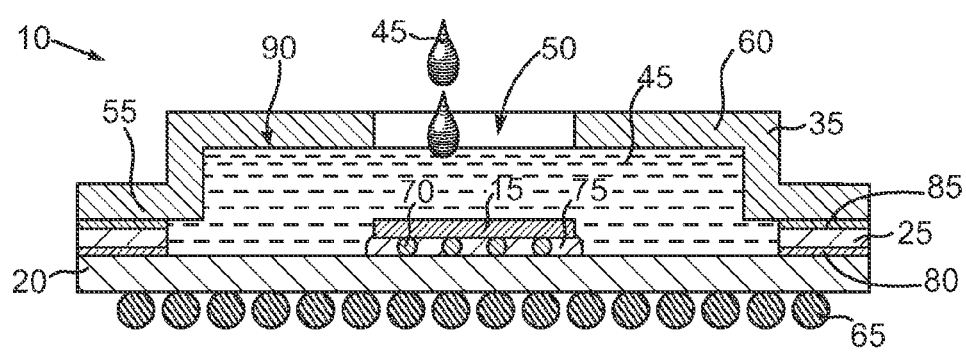
FIG. 2 is a sectional view of FIG. 1 taken at section 2-2.

Additional details of the semiconductor device 10 may be understood by referring now also to FIG. 2, which is a sectional view of FIG. 1 taken at section 2-2. The semiconductor chip 15 may be flip-chip mounted to the circuit board 20 as shown and interfaced electrically thereto by way of interconnect structures 70. The interconnect structures 70 may be solder joints composed of mating conductive bumps, conductive pillars with or without solder caps or other types of interconnect structures. Indeed, even wire bonding could be used in lieu of or in addition to the flip-chip type interconnect structures. A suitable underfill material layer 75 may be placed between the semiconductor chip 15 and the circuit board 20 to lessen the effects of differential CTE. The stiffener frame 25 may be secured to the circuit board 20 by way of a suitable adhesive 80, which may be a polymeric adhesive or even a solder as desired. Optionally, the stiffener frame 25 could be fabricated using the same types of build-up materials used to fabricate the circuit board itself. The lid 35 may be composed of a variety of materials, such as well-known thermosetting plastics, thermoplastics or other polymeric materials and may be secured to the stiffener frame 25 by way of a suitable adhesive 85 which may be a polymeric adhesive or even a solder.

The thermal interface material 45 may be introduced through the opening 50 in such quantity to at least reach the lower surface 90 of the cap portion 60 of the lid 35. It may be desirable to add enough thermal interface material 45 so that even portions or all of the opening 50 are filled therewith. A variety of materials may be used for the liquid thermal interface material 45. Flowability at or near room temperatures or perhaps other temperatures is a desirable feature, since it is preferred that the thermal interface material 45 readily behave as a fluid in the internal cavity 40 and fill any voids and encompass the semiconductor chip 15 for more favorable thermal conduction. Examples include water, isopropyl alcohol, glycol, various oils, silicone oils, dielectric liquids, such as Galden® liquids or the like, or even a metal such as gallium if appropriate electrical insulation is provided. Galden® liquids are low molecular weight perfluoropolyether (PFPE) fluids having the general chemical structure of:

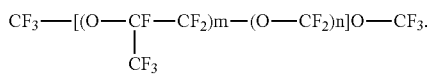

A variety of techniques may be used to load the semiconductor chip device 10 with the liquid thermal interface material and apply a secondary lid or heat spreader. One exemplary method is illustrated in FIG. 3, which is a sectional view depicting a circuit board 95 supported on a support member 97 and the semiconductor chip device 10 positioned on the circuit board 95. The circuit board 95 may take on a variety of configurations, such as the examples disclosed herein for the circuit board 20 depicted in FIGS. 1 and 2. The semiconductor chip device 10 is electrically interfaced with the circuit board 95 by way of the ball grid array 65, which is subjected to a reflow. However, as noted above, other types of interface structures could be used as well. Note that the semiconductor chip device 10 is depicted with a full load of the liquid thermal interface material 45 and is fitted with a secondary lid 100 that includes a surface 105 designed to seat on the cap portion 60 of the lid 35 and a flange surface 107 that is designed to seat on the bill portion 55 of the lid 35. Another semiconductor chip device 110 is shown mounted to the circuit board 95 and undergoing loading of the liquid thermal interface material 45. As shown, following the loading of the liquid thermal interface material 45, another secondary lid 117 may be mounted to the semiconductor chip device 110 in the same fashion as for the semiconductor chip device 10. The secondary lids 100 and 117 may be secured to the semiconductor chip devices 10 and 110 by way of suitable thermal compression adhesives, other types of polymeric adhesives or even solders if for example the lid 35 of the semiconductor chip device 10 and the corresponding lid (not labeled) of the semiconductor chip device 110 are composed of solderable materials. The secondary lids 110 and 117 and any alternatives thereof described herein may be composed of copper, nickel, aluminum, steel, combinations of these or the like. Somewhat more exotic materials, such as diamond or sapphire, could also be used for extreme thermal environments. Optionally, the secondary lids 110 and 117 and any alternatives thereof described herein may include a vapor chamber, a solid state thermoelectric cooler or the like.

Since the thermal interface material 45 is loaded as a liquid, it is desirable to maintain the semiconductor chip devices 10 and 110 in a substantially level state during the loading and attachment of the secondary lids 100 and 117. To facilitate this leveling, the circuit board 95 may be mounted to the support member 97 as shown, which may include a table 125 upon which the circuit board 95 is seated. The table 125 is, in turn, mounted to another table 130 by way of plural support legs, two of which are visible and labeled 135 and 140, but which may number four or more. The legs 135 and 140 are adjustable so that respective sides 145 and 150 of the table 125 may be moved along the z-axis in order to adequately level the semiconductor chip devices 10 and 110 prior to the loading of the thermal interface material 45. In addition, it is desirable to constrain the movement of the circuit board 95 in the x-y plane prior to enduring the loading of the thermal interface material 45 and the application of the secondary lids 100 and 117. To constrain the lateral movement of the circuit board 95, the table 125 may be fitted with one or more elbow shaped brackets, two of which are visible and labeled 155 and 160. The skilled artisan will appreciate that the number of such brackets 155 and 160 may total four or more depending upon the complexity of the table 125. The brackets 155 and 160 may be movable in the x-y plane in order to engage and bear against the circuit board 95.

To facilitate the z-axis adjustment of the table 125, the adjustable legs 135 and 140 may consist of respective female portions 165 and 170 which are designed to journal over corresponding pegs 175 and 180 which project upwardly from the secondary table 130. Set screws 185 and 190 of the female portions 165 and 170 may be used to hold the female portions 165 and 170 relative to the pegs 175 and 180 in a particular desired z-axis orientation in order to level the table 125. However, the skilled artisan will appreciate that a huge variety of different types of mechanisms may be used to facilitate the selective z-axis movement of the table 125.

In the foregoing illustrative embodiment, secondary lids 100 and 117 secured by some form of adhesive are used to enclose the liquid thermal interface material 45. However, the skilled artisan will appreciate that other types of fastening methods may be used to secure an enclosure to a given semiconductor chip device to trap a liquid thermal interface material. In this regard, attention is now turned to FIG. 4, which is a sectional view like FIG. 3 but of the semiconductor chip devices 10 and 110 fitted with alternate exemplary secondary lids. Here, the alternate exemplary secondary lids 100' and 117' may be seated on the corresponding semiconductor chip devices 10 and 110 but secured by way of pins 195, 200, 205 and 210. The semiconductor chip device 110 is depicted at the stage of dispensing the liquid thermal interface material 45 and just prior to the seating of the secondary lid 117. The pins 205 and 210 may include broad heads 215 and 220, which are designed to penetrate corresponding bores 225 and 230 that extend not only through the circuit board 95' but also through a mounting plate 235, which is mounted to a lower surface 240 of the circuit board 95'. When the broad heads 215 penetrate through the bores 225 and 230 they re-expand and engage the mounting bracket 235. Since temporary compression followed by expansion is desired, the pins 205 and 210 are advantageously composed of various well-known plastics. The secured state is depicted for the pins 195 and 200 of the secondary lid 100' for the semiconductor device 10. A support member 97' may be used to hold the circuit board 95 during the dispensing of the liquid thermal interface material and the mounting of the secondary lids 100' and 117' as generally described above in conjunction with FIG. 3 with the notable exception that the table now labeled 125' should include suitable openings 245 and 250 which are designed to accommodate the placement of the mounting bracket 235 and an identical mounting bracket 255 for the semiconductor chip device 10.

Figure 5:
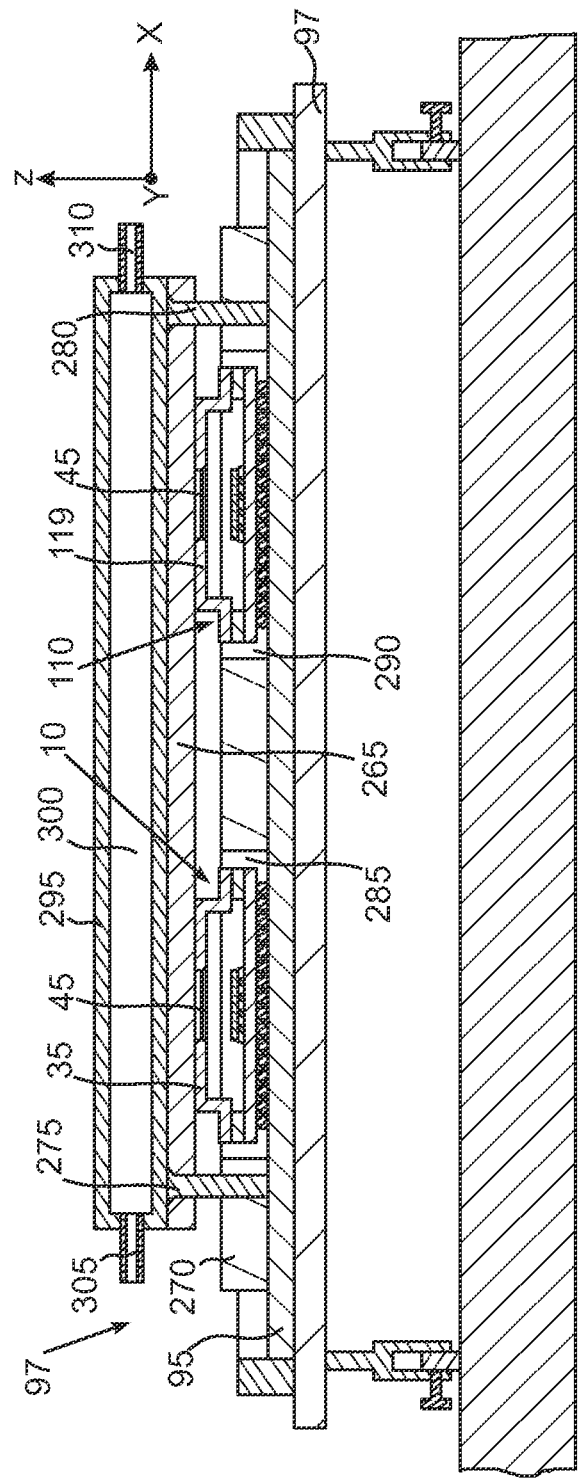
FIG. 5 is a sectional view depicting another alternate exemplary semiconductor chip device supported on another alternate exemplary support member.

Additional thermal management may be utilized in conjunction with the semiconductor chip devices 10 and 110. In this regard, attention is now turned to FIG. 5, which is a sectional view depicting the semiconductor chip devices 10 and 110 mounted to the circuit board 95. The circuit board 95 is, in turn, seated on the apparatus which is described elsewhere herein. Here, the support member 97 may be used to hold the circuit board 95 and the semiconductor chip devices 10 and 110 during the dispensing of the liquid thermal interface material 45 and the placement of a single unified secondary lid or heat spreader plate 265, which is designed to seat on the respective lids 35 and 119 of the semiconductor chip devices 10 and 110. The plate 265 may be composed of a variety of thermally conductive materials, such as, for example, copper, nickel, aluminum, steel, combinations of these or the like. Somewhat more exotic materials, such as diamond or sapphire, could also be used for extreme thermal environments. A thermal grease (not shown) may be applied to the interface between the plate 265 and lids 35 and 119 in order to further enhance conductive heat transfer between the components. A variety of techniques may be used to fasten the plate 265 to the circuit board 95. In this illustrative embodiment, the circuit board 95 may be provided with a plate 270 that is designed to receive respective pins 275 and 280 of the plate 265. The pins 275 and 280 may be typical pins, screws or a variety of other fasteners as desired. The plate 270 is provided with openings 285 and 290 that are designed to accommodate the placement of the semiconductor chip devices 10 and 110. The plate 270 may be secured to the circuit board 95 by well-known adhesives or even a solder if desired. To provide an active cooling solution, a heat exchanger 295 may be seated on the plate 265 and include an internal volume 300 that is designed to receive a cooling fluid via one or more inlets 305 and to discharge the cooling fluid via one or more outlets 310. The heat exchanger 295 may be connected to some form of active pumping system (not shown) or may be merely secured to some larger volume of cooling fluid and use passive cooling. Again, the support member 97 may be used to provide selective movement of the table 125 along the z-axis and sufficient constraint of the circuit board movement in the x-y plane.

Figure 6:
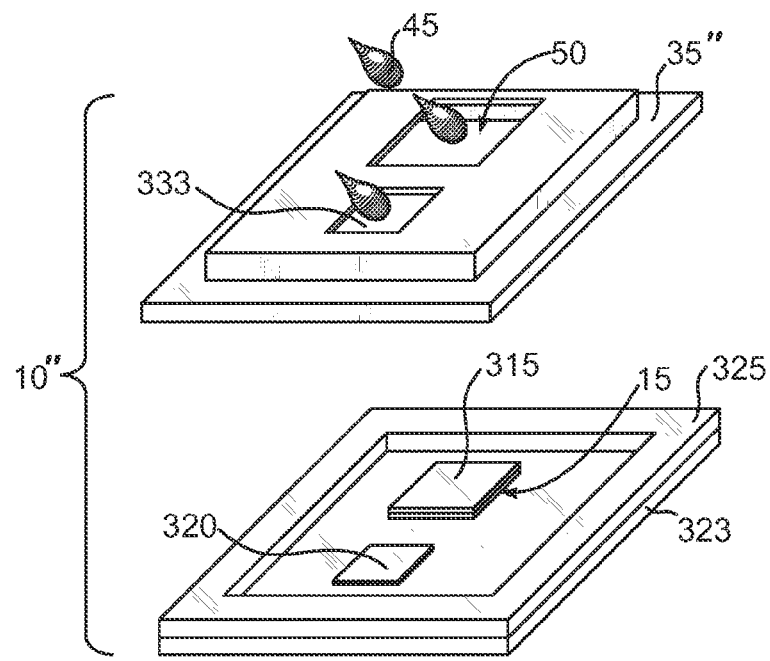
FIG. 6 is a partially exploded pictorial view of an alternate exemplary embodiment of a semiconductor chip device that includes multiple semiconductor chips mounted on a circuit board.

In the foregoing illustrative embodiments, the lid for a given semiconductor chip device includes a single opening. However, it should be understood that a lid designed to enclose a volume of a liquid thermal interface material may be provided with more than one opening. In this regard, attention is now turned to FIG. 6, which is a partially exploded pictorial view like FIG. 1 but of an alternate exemplary embodiment of a semiconductor chip device 10" which includes plural stacked semiconductor chips 15 and 315 and another semiconductor chip 320 that is laterally displaced from the stacked semiconductor chips 15 and 315. The semiconductor chips 15, 315 and 320 may be mounted to a suitable circuit board 323 and circumscribed laterally by way of a stiffener frame 325. The circuit board 323 and the stiffener frame 325 may be configured substantially as described elsewhere herein. Here, the lid 35' may be a top hat design as described generally elsewhere herein with not one but two openings 50 and 333. The opening 50 is designed to be positioned approximately in alignment with the stacked semiconductor chips 15 and 315 and the opening 333 is designed to be relatively aligned with the semiconductor chip 320 when the lid 35' is seated on the stiffener frame 325. The liquid thermal interface material 45 may be dispensed through the openings 50 and 333 as generally described elsewhere herein.

The skilled artisan will appreciate that there are other possible techniques to load a liquid thermal interface material into an interior space defined by a circuit board and a lid attached thereto. In this regard, attention is now turned to FIG. 7, which is a sectional view of an alternate exemplary embodiment of a semiconductor chip device 10'''. The chip device 10''' includes the aforementioned circuit board 20 and a bathtub type lid 35''' secured thereto by way of a suitable adhesive 337. Plural semiconductor chips 15 and 315 may be stacked on the circuit board 20. The semiconductor chip 15 may be electrically interfaced to the circuit board 20 by way of interconnect structures 70 as described elsewhere herein. An additional set of interconnect structures 339 may be used to electrically connect the semiconductor chip 315 to the semiconductor chip 15. Here, the semiconductor chip device 10''' may be flipped up on its side and inserted into a suitable jig 341. The lid 35''' may be provided with one or more inlet passages 343 and at least one outlet passage 346. A suitable applicator 349 may be used to introduce the liquid thermal interface material 45 into the interior space enclosed by the lid 35''' and the circuit board 20. The outlet passage 346 may be used to facilitate the liberation of trapped air during the filling of the liquid thermal interface material 45.

Figure 7:
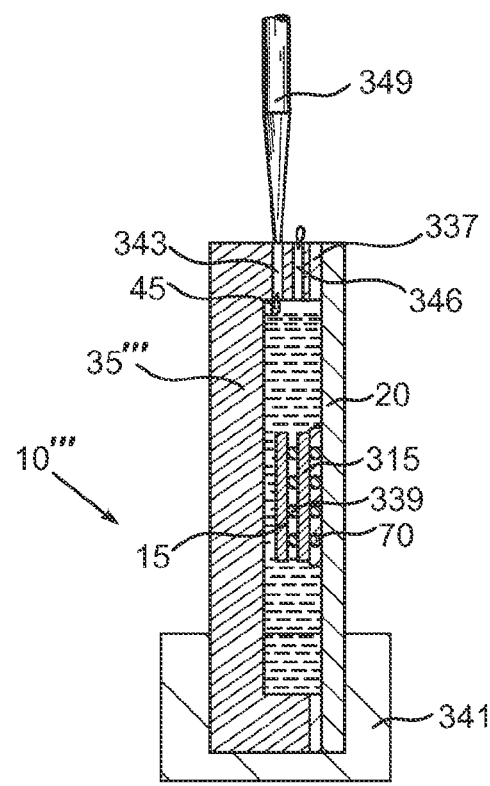
FIG. 7 is a sectional view of an alternate exemplary semiconductor chip device undergoing exemplary liquid thermal interface material filling.
Figure 8:
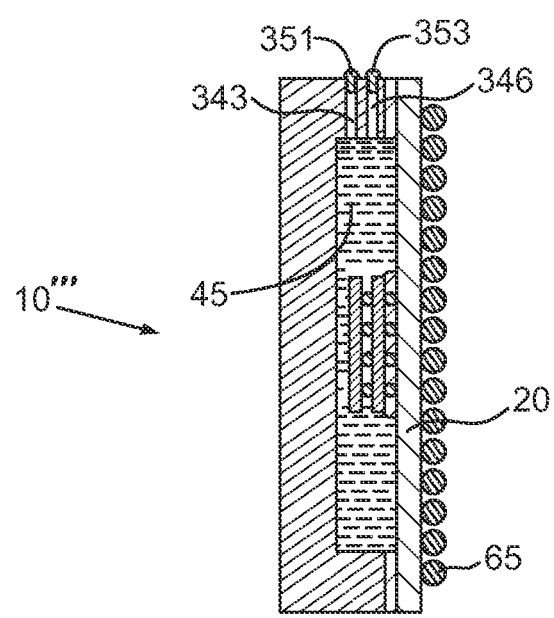
FIG. 8 is a sectional view like FIG. 7 but depicting sealing of the semiconductor chip device after liquid thermal interface material filling.

As shown in FIG. 7, following the filling of the thermal interface material 45, the inlet and outlet passages 343 and 346 may be sealed by corresponding plugs 351 and 353. The plugs 351 and 353 may be composed of adhesives, solders or even small structural plugs. Following the application of the plugs 351 and 353, an interconnect system such as the depicted ball grid array 65 may be attached to the circuit board 20 in advance of a subsequent mounting operation.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a semiconductor chip device including a circuit board and a first semiconductor chip coupled thereto;
placing a lid on the circuit board, the lid including an opening and an internal cavity in which the first semiconductor chip is positioned; and
placing a liquid thermal interface material in the internal cavity to encompass the first semiconductor chip and to establish thermal contact with the first semiconductor chip and the circuit board, the liquid thermal interface material being operable to be in a liquid state during operation of the first semiconductor chip.

2. The method of claim 1, comprising placing the liquid thermal interface material in the internal cavity through the opening.

3. The method of claim 1, comprising placing the circuit board on a support member operable to maintain the circuit board substantially level during placement of the liquid thermal interface material.

4. The method of claim 1, comprising placing a heat spreader on the lid.

5. The method of claim 4, wherein the heat spreader closes off the opening.

6. The method of claim 4, wherein the heat spreader comprises a heat exchanger.

7. The method of claim 1, wherein the semiconductor chip device comprises a second semiconductor chip.

8. The method of claim 7, wherein the second semiconductor chip is stacked on the first semiconductor chip.

9. A method of manufacturing, comprising:
providing a semiconductor chip package including a package substrate and a first semiconductor chip coupled thereto;
placing a lid on the package substrate, the lid including an opening and an internal cavity in which the first semiconductor chip is positioned; and
placing a liquid thermal interface material in the internal cavity to encompass the first semiconductor chip and to establish thermal contact with the first semiconductor chip and the circuit board, the liquid thermal interface material being operable to be in a liquid state during operation of the first semiconductor chip.

10. The method of claim 9, comprising placing the liquid thermal interface material in the internal cavity through the opening.

11. The method of claim 9, comprising placing the circuit board on a support member operable to maintain the circuit board substantially level during placement of the liquid thermal interface material.

12. The method of claim 9, comprising placing a heat spreader on the lid.

13. The method of claim 12, wherein the heat spreader closes off the opening.

14. The method of claim 12, wherein the heat spreader comprises a heat exchanger.

15. The method of claim 9, wherein the semiconductor chip device comprises a second semiconductor chip.

16. The method of claim 15, wherein the second semiconductor chip is stacked on the first semiconductor chip.

17. An apparatus, comprising:
a circuit board;
a first semiconductor chip coupled to the circuit board;
a lid coupled to the circuit board, the lid including an opening and an internal cavity in which the first semiconductor chip is positioned; and
a liquid thermal interface material in the internal cavity encompassing the first semiconductor chip and in thermal contact with the first semiconductor chip and the circuit board, the liquid thermal interface material being operable to be in a liquid state during operation of the first semiconductor chip.

18. The apparatus of claim 17, wherein the lid comprises an opening to enable the liquid thermal interface material to enter the internal cavity.

19. The apparatus of claim 17, comprising a support member operable to support and maintain the circuit board substantially level during placement of the liquid thermal interface material.

20. The apparatus of claim 17, comprising a heat spreader on the lid.

21. The apparatus of claim 20, wherein the heat spreader comprises a heat exchanger.

22. The apparatus of claim 17, wherein the apparatus comprises a second semiconductor chip coupled to the circuit board.

23. The apparatus of claim 22, wherein the second semiconductor chip is stacked on the first semiconductor chip.

* * * * *